United States Patent
Kim et al.

(10) Patent No.: US 12,096,147 B2
(45) Date of Patent: *Sep. 17, 2024

(54) IMAGE SENSOR AND METHOD OF OPERATING AN IMAGE SENSOR

(71) Applicant: SAMSUNG ELECTRONICS CO., LTD., Suwon-si (KR)

(72) Inventors: Sung Yong Kim, Hwaseong-si (KR); Kyung-Min Kim, Seoul (KR); Hyuk Oh, Yongin-si (KR); Hyeok Jong Lee, Yongin-si (KR); Seung Hoon Jung, Yongin-si (KR); Woong Joo, Seoul (KR); Hee Sung Chae, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 253 days.

This patent is subject to a terminal disclaimer.

(21) Appl. No.: 17/878,285

(22) Filed: Aug. 1, 2022

(65) Prior Publication Data
US 2022/0377273 A1 Nov. 24, 2022

Related U.S. Application Data

(63) Continuation of application No. 16/746,213, filed on Jan. 17, 2020, now Pat. No. 11,445,139.

(30) Foreign Application Priority Data

Jun. 12, 2019 (KR) .................... 10-2019-0069027

(51) Int. Cl.
| | | |
|---|---|---|
| H04N 25/75 | (2023.01) | |
| H04N 25/709 | (2023.01) | |
| H03M 1/56 | (2006.01) | |

(52) U.S. Cl.
CPC .......... *H04N 25/75* (2023.01); *H04N 25/709* (2023.01); *H03M 1/56* (2013.01)

(58) Field of Classification Search
CPC ........ H04N 25/75; H04N 25/709; H03M 1/56
See application file for complete search history.

(56) References Cited

U.S. PATENT DOCUMENTS

| | | |
|---|---|---|
| 7,304,599 B2 | 12/2007 | Lee |
| 8,081,243 B2 | 12/2011 | Chou |

(Continued)

FOREIGN PATENT DOCUMENTS

| | | |
|---|---|---|
| JP | 2018-125623 A | 8/2018 |
| KR | 10-1631622 B1 | 6/2016 |
| KR | 10-2015-0058792 B1 | 4/2020 |

OTHER PUBLICATIONS

First OA dated Jun. 24, 2024 for corresponding application No. KR 10-2019-0069027.

*Primary Examiner* — Twyler L Haskins
*Assistant Examiner* — Fayez A Bhuiyan
(74) *Attorney, Agent, or Firm* — Muir Patent Law, PLLC

(57) ABSTRACT

An analog-digital converter includes a count code generator to receive a code generation clock signal from a clock signal generator and to output a count code according to the code generation clock signal, a latch to latch the count code, an operating circuit to generate a count value of the count code and to output a digital signal based on the count value, and a transfer controller to transfer the count code from the latch to the operating circuit. The transfer controller determines whether to transfer the count code according to a logic level of a count enable clock signal generated from the clock signal generator.

20 Claims, 14 Drawing Sheets

(56) References Cited

U.S. PATENT DOCUMENTS

| | | |
|---|---|---|
| 9,019,138 B2 | 4/2015 | Iwaki |
| 9,166,613 B2 | 10/2015 | Tanaka |
| 9,374,527 B2 | 6/2016 | Yang et al. |
| 9,503,666 B2 | 11/2016 | Yin et al. |
| 11,445,139 B2 * | 9/2022 | Kim .................... H03M 1/1295 |
| 2009/0040352 A1 | 2/2009 | Kawaguchi |
| 2017/0208273 A1 | 7/2017 | Mandelli et al. |

* cited by examiner

IMAGE SENSOR AND METHOD OF OPERATING AN IMAGE SENSOR

CROSS-REFERENCE TO RELATED APPLICATIONS

This application is a continuation of pending U.S. application Ser. No. 16/746,213, filed on Jan. 17, 2020, the entire contents of which are hereby incorporated by reference.

Korean Patent Application No. 10-2019-0069027, filed on Jun. 12, 2019, in the Korean Intellectual Property Office, and entitled: "Analog-Digital Converter and Image Sensor Including Thereof," is incorporated by reference herein in its entirety.

BACKGROUND

1. Field

Embodiments relate to an analog-digital converter and an image sensor including the same analog-digital converter, and more particularly, to an analog-digital converter including a transfer control circuit for controlling transmission of a count code, and an image sensor including the same analog-digital converter.

2. Description of the Related Art

An image sensor is a device able to capture a two-dimensional or three-dimensional image of an object. The image sensor may generate the captured image of the object, with a photoelectric conversion element that reacts according to intensity of light reflected from the object.

As a complementary metal-oxide semiconductor (CMOS) technology has been developed, CMOS image sensors using the CMOS technology have been widely used to capture images. The CMOS image sensors may use a correlated double sampling (CDS) method for the image capture, may perform a counting operation on a signal sampled by the CDS method corresponding to, e.g., a difference between a reset signal and a video signal, and may outputs the result of the counting operation as a digital signal.

A high peak current may be generated in certain periods for the counting operation, e.g., when multi-bit toggling is happening. Further, a peak current of a certain level or more may deteriorate a quality of pixel data and may cause abnormality or the like of a system including the CMOS image sensors. Thus, a technique for preventing the deteriorated quality of the pixel data may be demanded.

SUMMARY

Embodiments are directed to an analog-digital converter. The analog-digital converter may include a count code generator to receive a code generation clock signal from a clock signal generator and to output a count code according to the code generation clock signal; a latch to latch the count code; an operating circuit to generate a count value of the count code, and to output a digital signal based on the count value; and a transfer controller to transfer the count code from the latch to the operating circuit. The transfer controller determines whether to transfer the count code according to a logic level of a count enable clock signal generated from the clock signal generator.

Embodiments are directed to an analog-digital converter. The analog-digital converter may include a comparator to receive a first pixel signal during a first sensing cycle and to receive a second pixel signal during a second sensing cycle; and a counter to output a digital signal of the second pixel signal according to a count enable clock signal. In the first and second sensing cycles, the counter does not output the digital signal when the count enable clock signal is a first level, and the counter outputs the digital signal when the count enable clock signal is a second level different from the first level.

Embodiments are directed to an analog-digital converter. The analog-digital converter may include a comparator to compare a pixel signal with a reference signal and to output a comparison result signal; a code generator to output a count code according to a code generation clock signal; a memory connected to the comparator and the code generator, the memory to store the count code based on a level of the comparison result signal; an operating circuit connected to the memory, the operating circuit to output a count result value of the comparison result signal based on the count code; and a controller to control operations of the comparator, the code generator, the memory, and the operating circuit. The count code is not transferred to the operating circuit in a first period in which the count code is stored in the memory by the controller, and the count code is transferred to the operating circuit in a second period in which the count code is stored and maintained in the memory by the controller.

Embodiments are directed to an image sensor. The image sensor may include a pixel array including a plurality of pixels; a reference signal generator to output a reference signal; and an analog-digital converter to receive a pixel signal output from each pixel connected to column lines and the reference signal. The analog-digital converter includes: a comparator to compare the pixel signal with the reference signal and to output a comparison result signal, a count code generator to receive a code generation clock signal from a clock signal generator and to output a count code according to the code generation clock signal, a latch to latch the count code, an operating circuit connected to a terminal end of the latch, to generate a count value of the count code, and to output a digital signal of the pixel signal based on the count value, and a transfer controller to transfer the count code to the operating circuit through the latch, the transfer controller to determine whether to transfer the count code according to a logic level of a count enable clock signal generated from the clock signal generator.

BRIEF DESCRIPTION OF THE DRAWINGS

Features will become apparent to those of skill in the art by describing in detail exemplary embodiments with reference to the attached drawings in which.

DETAILED DESCRIPTION

Hereinafter, an analog-digital converter and an image sensor according to some embodiments will be described with reference to FIGS. 1 through 16.

Figure 1:
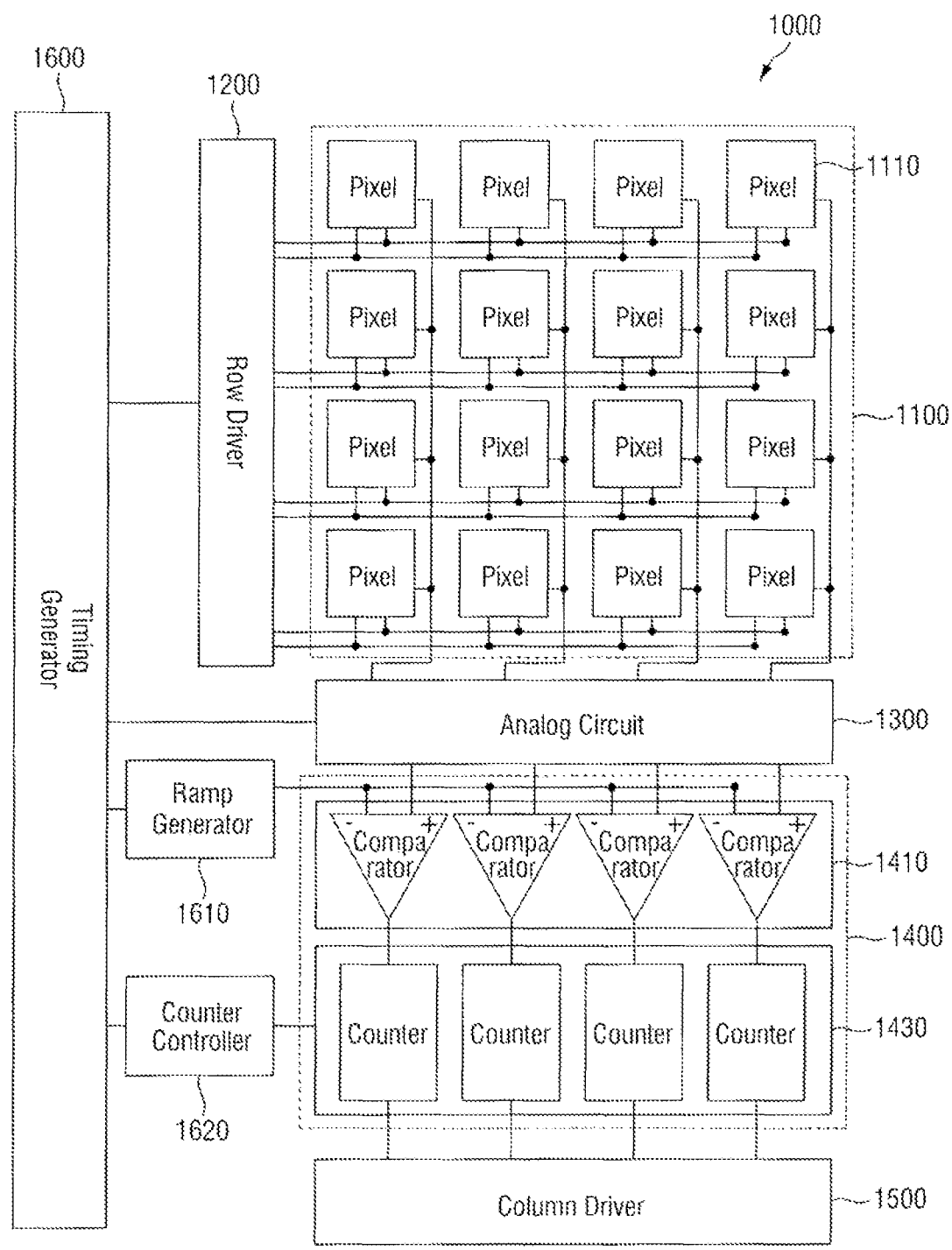
FIG. 1 illustrates an image sensor according to some embodiments.
Figure 2:
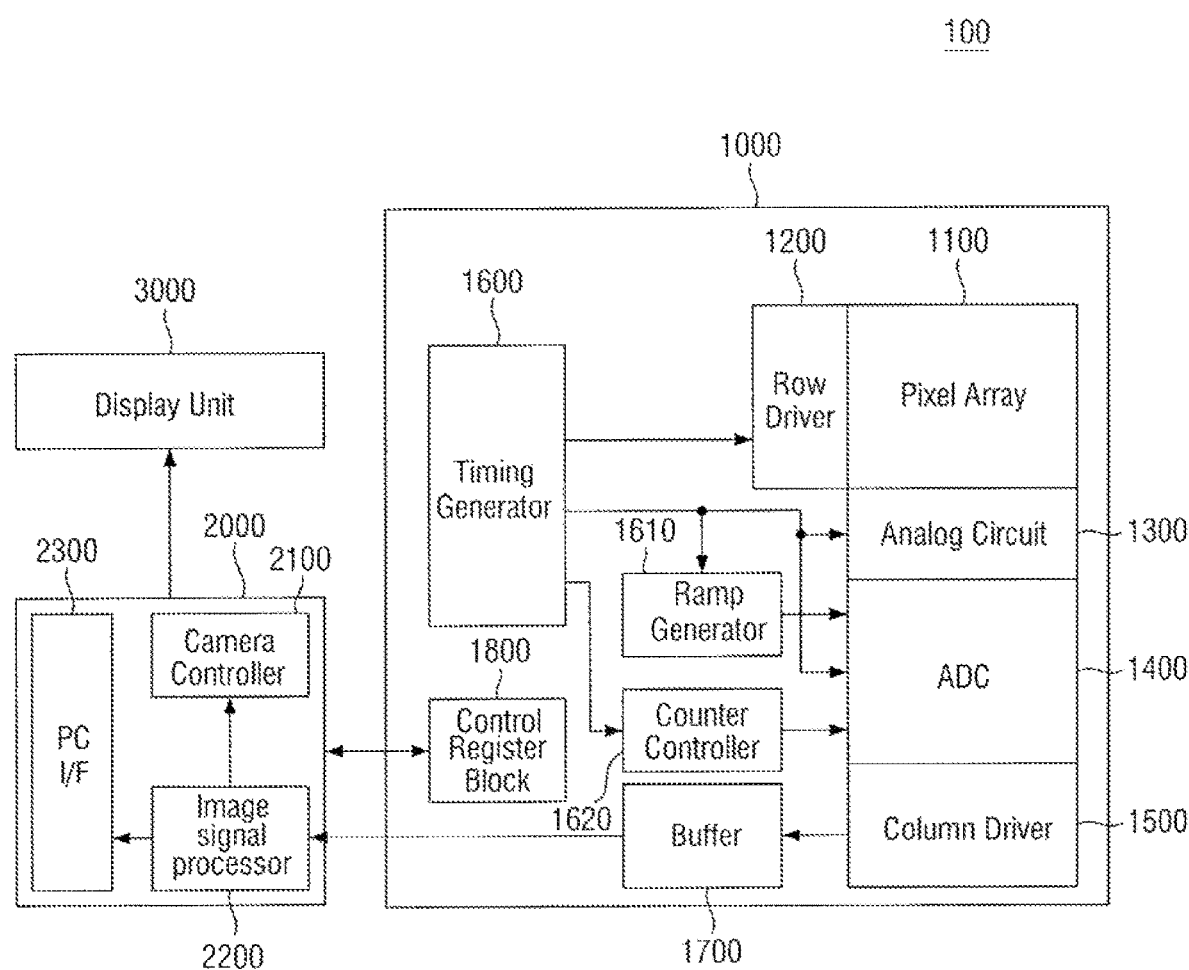
FIG. 2 illustrates an image processing system according to some embodiments.

FIG. 1 illustrates an image sensor according to some embodiments, and FIG. 2 illustrates an image processing system according to some embodiments. Referring to FIGS. 1 and 2, an image processing system 100 according to some embodiments may include an image sensor 1000, an image processor 2000, and a display unit 3000.

The image sensor 1000 according to some embodiments may include a pixel array 1100, a row driver 1200, an analog circuit 1300, an analog-digital converter (ADC) 1400, a column driver 1500, a timing signal generator 1600, a reference signal generator 1610, a counter controller 1620, a buffer 1700, and a control register block 1800.

The image sensor 1000 may sense an object information obtained through a lens under control of the image processor 2000 to generate image data. The image processor 2000 may output the image data generated by the image sensor 1000 to a display unit 3000. The display unit 3000 may display the image data and may include various kinds of devices capable of outputting the image data. For example, the display unit 3000 may include a computer, a smartphone, other video output terminals, and the like.

The image processor 2000 may include a camera controller 2100, an image signal processor 2200, and a personal computer interface (PC I/F) 2300. The camera controller 2100 may control the control register block 1800. For example, the camera controller 2100 may control the image sensor 1000 or the control register block 1800 using an inter-integrated circuit.

The image signal processor 2200 may receive image data from the buffer 1700, may process the image data, and may output the image data to the display unit 3000 through the PC I/F 2300. For example, as illustrated in FIG. 2, the image signal processor 2200 may be located inside the image processor 2000. Alternatively, the image signal processor 2200 may be located outside the image processor 2000. Further, the image signal processor 2200 may be located inside the image sensor 1000.

Referring to FIG. 1, the pixel array 1100 may include a plurality of pixels 1110 arranged in a matrix form. Each pixel 1110 may be connected to a plurality of row lines and a plurality of column lines. Each pixel 1110 may include a red pixel for converting light of a red spectral region into an electrical signal, a green pixel for converting light of a green spectral region into an electrical signal, and a blue pixel for converting light of a blue spectral region into an electrical signal.

Further, color filter arrays may be arranged above the pixel array 1100 including the plurality of pixels 1110. For example, each color filter array may allow light of a specific spectral region to penetrate therethrough.

The pixel array 1100 may include a plurality of light detection elements. For example, the plurality of light detection elements may be, e.g., a photodiode, a pinned photodiode, or the like. The pixel array 1100 may detect light with the plurality of light detection elements and may convert the detected light into an electric signal to generate a video signal. This will be described below with reference to FIG. 3.

The timing signal generator 1600 may output control signals or clock signals to each of the row driver 1200, the analog-digital converter (ADC) 1400, the reference signal generator 1610, and the counter controller 1620 to control operations or timings thereof. Further, the control register block 1800 may output control signals to each of the reference signal generator 1610, the timing signal generator 1600, the counter controller 1620, and the buffer 1700 to control the operations thereof. For example, the control register block 1800 may be controlled by the camera controller 2100. Further, the timing signal generator 1600 may be referred to as a clock signal generator.

The counter controller 1620 may receive the control signal from the control register block 1800 to generate a counter control signal. The counter controller 1620 may transfer the counter control signal to a plurality of counters 1430 in the analog-digital converter (ADC) 1400 to control the operations thereof. The counter control signal may include a code generation clock signal CODE_EN for controlling a count code generator 1431 in the analog-digital converter (ADC), a counter reset signal CNT_RST for controlling the plurality of counters 1430 in the analog-digital converter (ADC), and an inverted signal IVS for inverting internal bits of each of the plurality of counters 1430 in the analog-digital converter (ADC) 1400. For example, the code generation clock signal CODE_EN generated by the counter controller 1620 may control a count code generation of a count code generator 1431. For example, the counter reset signal CNT_RST generated by the counter controller 1620 may control reset operations of the plurality of counters 1430. For example, the inverted signal IVS generated by the counter controller 1620 may invert all the internal bits of each of the plurality of counters 1430. Further, the counter controller 1620 may receive a clock signal from the timing signal generator 1600 and supply a count enable clock signal CNT_EN and a latch enable clock signal LAT_EN to the plurality of counters 1430 in the analog-digital converter (ADC) 1400.

The row driver 1200 may drive the pixel array 1100 by each row. For example, the row driver 1200 may generate a row selection signal for selecting pixels in each row. Thus, the selected pixels in each row may output a reset signal and a video signal to the analog circuit 1300 according to the row selection signal. The analog circuit 1300 may perform a correlated double sampling operation on the reset signal and the video signal from the selected pixels in each row to generate a pixel signal PX_OUT.

The analog-digital converter (ADC) 1400 may receive a reference signal RAMP from the reference signal generator 1610 and the pixel signal PX_OUT from the analog circuit 130. Further, the analog-digital converter (ADC) 1400 may compare the reference signal RAMP with the pixel signal PX_OUT to output a comparison result signal COMP_OUT, may count the comparison result signal COMP_OUT to generate a digital value corresponding to the pixel signal PX_OUT, and may output the digital signal to the buffer 1700. According to some embodiments, the analog circuit 1300 may perform the correlated double sampling operation on the video signal from the pixels and may provide a correlated double sampled pixel signal PX_OUT to the comparator 1410. For example, the pixel signal PX_OUT may refer to the correlated double sampled pixel signal. Further, the buffer 1700 may temporarily store the digital signal output from the analog-digital converter (ADC) 1400 and may output the stored digital signal to the image processor 2000.

The analog-digital converter (ADC) 1400 according to some embodiments may include a plurality of comparators 1410 and a plurality of counters 1430. Each comparator 1410 may be connected to the analog circuit 1300 and the reference signal generator 1610. For example, the analog circuit 1300 may be connected to a first input end of each comparator 1410. The reference signal generator 1610 may be connected to a second input end of each comparator 1410.

Each comparator 1410 may receive the pixel signal PX_OUT output from the analog circuit 1300 and the reference signal RAMP generated from the reference signal generator 1610, may compare the pixel signal PX_OUT with the reference signal RAMP, and may output the comparison result signal COMP_OUT to an output end of the comparator 1410. For example, the comparison result signal COMP_OUT output from each comparator 1410 may correspond to a difference value between the video signal and the reset signal. For example, the difference value between the video signal and the reset signal may change according to illuminance of light incident on the pixels. The reference signal RAMP may be used to output the difference value between the video signal and the reset signal. The difference value between the video signal and the reset signal may be picked up and output in accordance with a slope of the reference signal RAMP. The reference signal generator 1610 may operate based on the control signal generated by the timing signal generator 1600.

The plurality of counters 1430 in the analog-digital converter (ADC) 1400 according to some embodiments may include a first counter for counting lower bits of N bits and a second counter for counting upper bits of M bits. The first counter may include a count code generator 1431 that generates an N-bit count code CODE<0>. The second counter may be, e.g., a ripple counter that counts the upper bits of the M bits. For example, the plurality of counters 1430 may refer to a first counter that counts lower bits.

Figure 3:
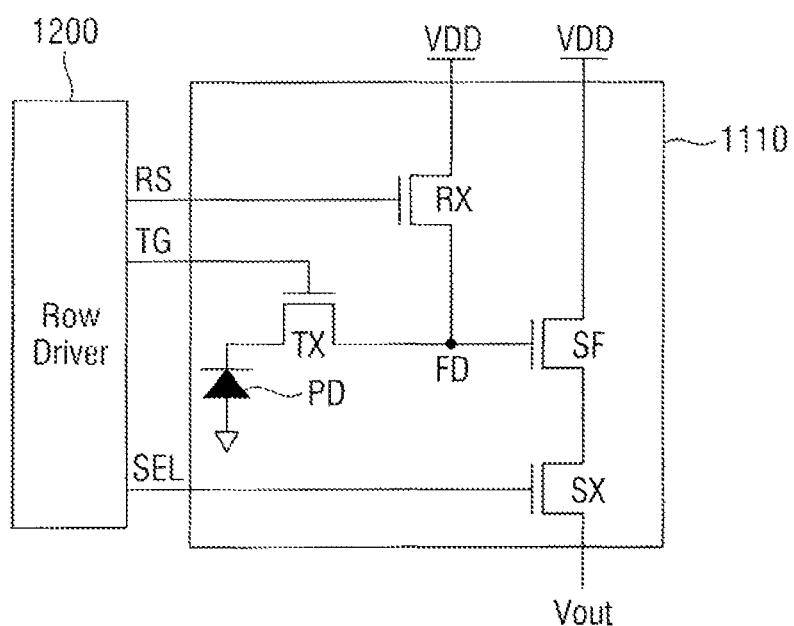
FIG. 3 illustrates a pixel shown in FIG. 1 according to some embodiments.

FIG. 3 illustrates a pixel and a row driver shown in FIG. 1 according to some embodiments. Referring to FIG. 3, the pixel 1110 may include a photodiode PD, a transfer transistor TX, a reset transistor RX, a source follower SF, and a selection transistor SX.

For example, one terminal of the transfer transistor TX may be connected to the photodiode PD. Another terminal of the transfer transistor TX may be connected to a floating diffusion region FD. A control terminal of the transfer transistor TX may receive a control signal TG.

For example, one terminal of the reset transistor RX may receive a power supply voltage VDD. Another terminal of the reset transistor RX may be connected to the floating diffusion region FD. A control terminal may receive a control signal RS. For example, one terminal of the source follower SF may receive the power supply voltage VDD. Another terminal of the reset transistor RX may be connected to one terminal of the selection transistor SX. A control terminal of the reset transistor RX may be connected to the floating diffusion region FD. Another terminal of the selection transistor SX may be connected to a column line CL for supplying an output signal Vout. A control terminal of the selection transistor SX may receive a control signal SEL.

Each of the control signals TG, RS, and SEL for controlling the transfer, reset, and selection transistors TX, RX, and SX may be output from the row driver 1200. The output signal Vout of the selection transistor SX may be supplied to the column line CL. Further, although a single photodiode PD and a single transfer transistor TX are shown in FIG. 3, each pixel 1110 may be implemented with a plurality of photodiodes PD and a plurality of transfer transistors TX that share the floating diffusion region FD.

Figure 4:
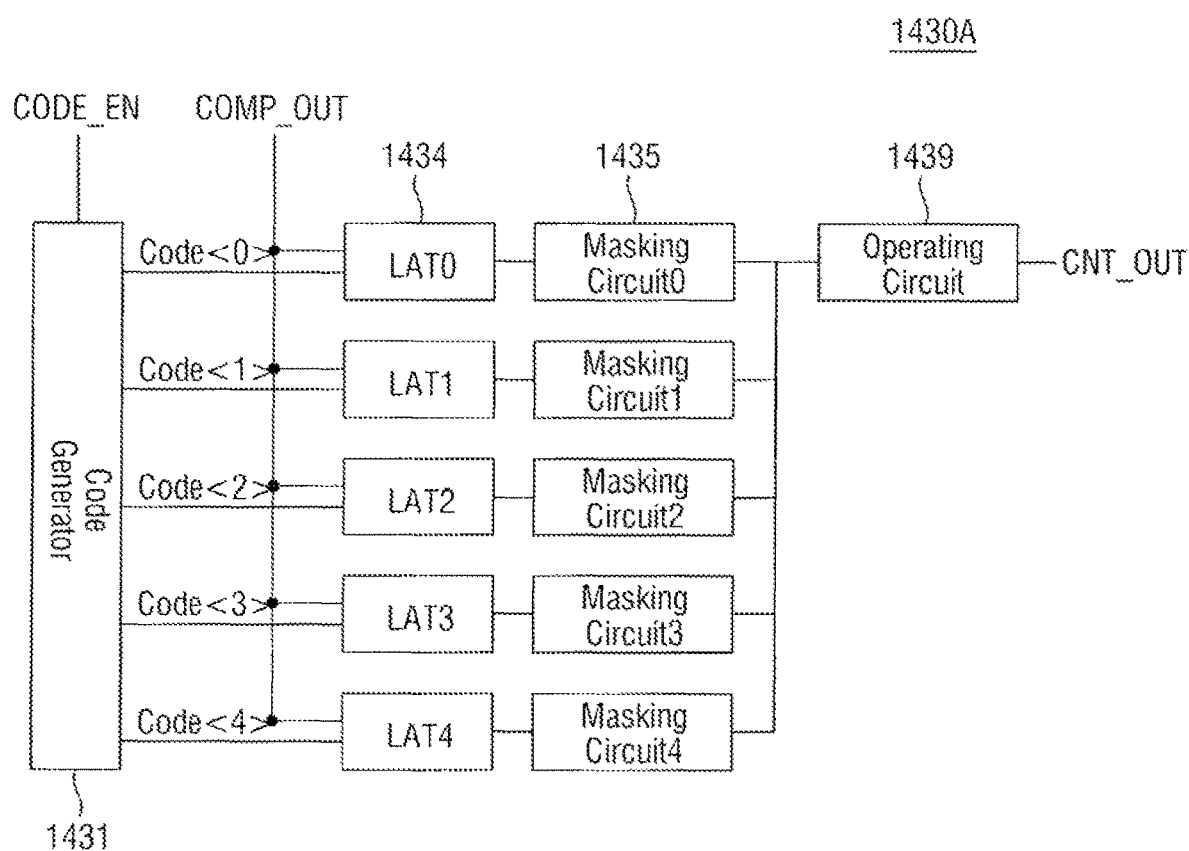
FIG. 4 illustrates a counter according to some embodiments.

FIG. 4 illustrates an example for explaining a counter according to some embodiments. Referring to FIG. 4, the count code generator 1431 may output 5-bit count codes (CODE<0>, CODE<1>, CODE<2>, CODE<3>, and CODE<4>). Further, the number of bits of the count codes generated by the count code generator 1431 may be changed. Referring to FIG. 4, each of a plurality of counters 1430A according to some embodiments may include a count code generator 1431, a plurality of latches LAT0 to LAT4, a plurality of masking circuits (Masking Circuit0 to Masking Circuit4), and an operating circuit 1439.

The count code generator 1431 may receive a code generation clock signal CODE_EN from the timing signal generator 1600 and output count codes (CODE<0> to CODE<4>) in accordance with the code generation clock signal CODE_EN. The count codes (CODE<0> to CODE<4>) output from the count code generator 1431 may be latched to the corresponding latches LAT4 to LAT0.

For example, the plurality of latches LAT0 to LAT4 latch the corresponding count codes (CODE<0> to CODE<4>), respectively. Hereinafter, an operation of the latch LAT0 1434 will be described. Further, other latches LAT1 to LAT4 may operate in a similar manner to the latch LAT0. The latch LAT0 may latch the count code CODE<0> based on a level of the comparison result signal COMP_OUT output from the comparator 1410 and may transfer the count code CODE<0> to the operating circuit 1439.

The masking circuit 1435 may be connected between the latch 1434 and the operating circuit 1439. The masking circuit 1435 may transfer the count code CODE<0> from the latch 1434 to the operating circuit 1439. The masking circuit 1435 may be connected to each of the plurality of latches LAT1 to LAT4. Hereinafter, an operation of the masking circuit 1435 connected to the latch LAT0 for latching the count code CODE<0> will be described. Further, the other masking circuits (Masking Circuits 1 to 4) may operate in a similar manner. For example, the masking circuit 1435 may also be referred to as a transfer control circuit.

The operating circuit 1439 may be connected to the masking circuit 1435, may receive the count code CODE<0>, which is generated by the count code generator 1431 and latched by the latch LAT0, and may generate a count value as a digital signal. The operating circuit 1439 may further include an adder. The adder may add the count values corresponding to the codes (CODE<0> to CODE<4>) and may output a sum value of the count values.

Figure 5:
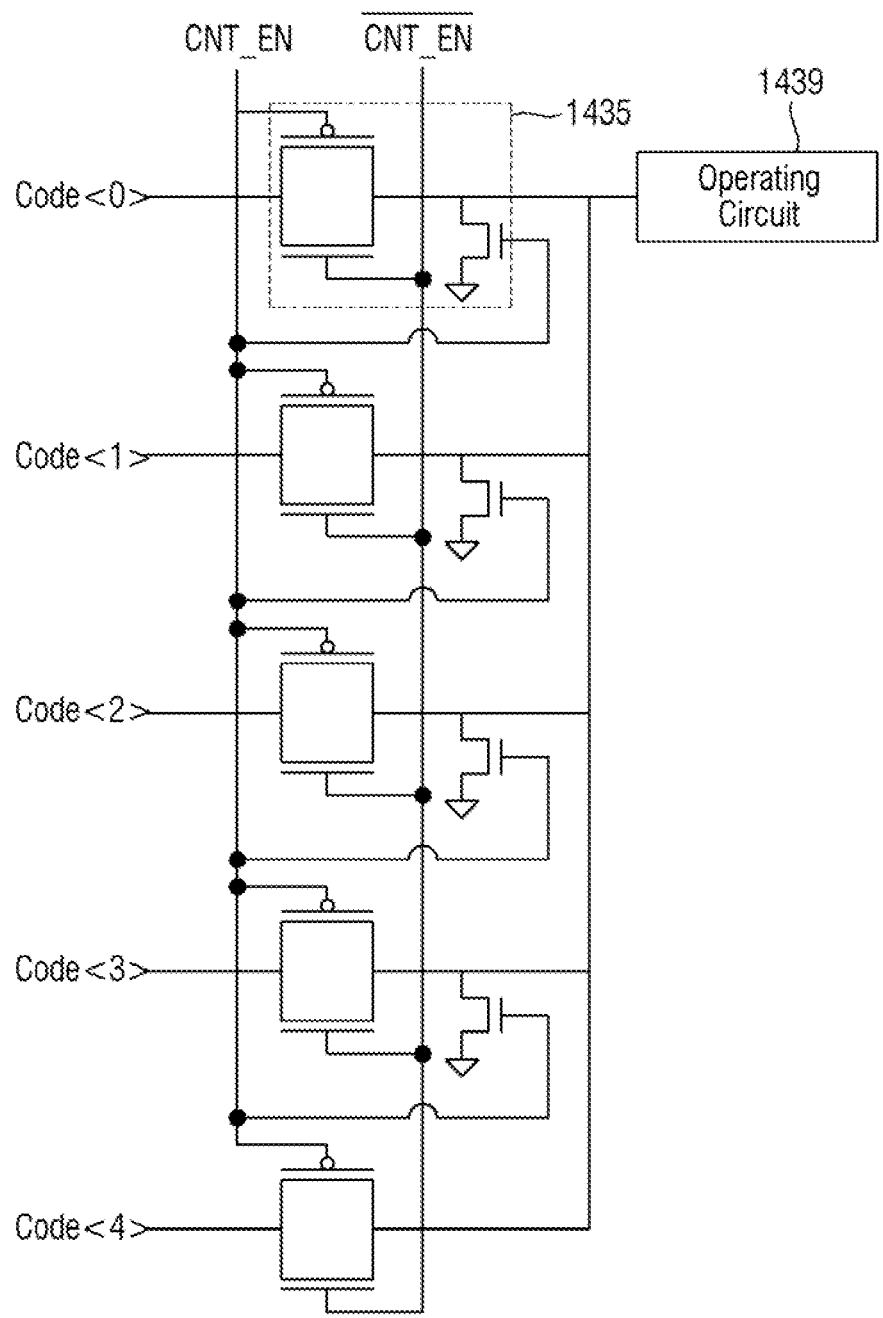
FIG. 5 illustrates a masking circuit according to some embodiments.

FIG. 5 illustrates an example for explaining the masking circuit according to some embodiments. Referring to FIG. 5, the masking circuit 1435 may include a pass transistor. According to some embodiments, the masking circuit 1435 may further include a pass transistor that determines whether to open or close a switch according to a logic level of a count enable clock signal CNT_EN.

The pass transistor of the masking circuit 1435 may include, e.g., a PMOS transistor and an NMOS transistor. For example, the count enable clock signal CNT_EN may be input to a gate electrode of the PMOS transistor of the pass transistor, and an inverted count enable clock signal $\overline{\text{CNT\_EN}}$ may be input to a gate electrode of the NMOS transistor of the pass transistor. For example, the count enable clock bar signal $\overline{\text{CNT\_EN}}$ may be an inverted signal of the count enable clock signal CNT_EN. Thus, the masking circuit 1435 may have a switch-off status so that the count code CODE<0> may not be transferred to the operating circuit 1439 when the count enable clock signal CNT_EN is a logic high level. Further, the masking circuit 1435 may have a switch-on status so that the count code CODE<0> may be transferred to the operating circuit 1439 when the count enable clock signal CNT_EN is a logic low level.

Figure 6:
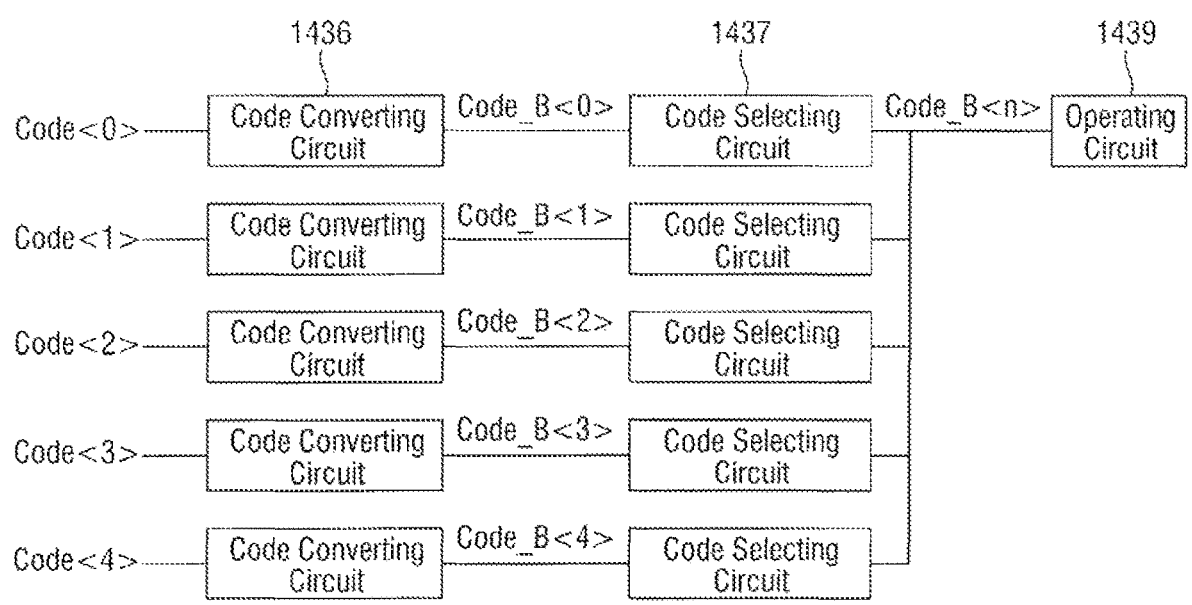
FIG. 6 illustrates a code converting circuit and a code selecting circuit according to some embodiments.

FIG. 6 illustrates an example for explaining a code converting circuit and a code selecting circuit according to some embodiments. Referring to FIG. 6, the analog-digital converter (ADC) 1400 according to some embodiments may further include a plurality of code converting circuits 1436 and a plurality of code selecting circuits 1437.

For example, one of the plurality of code converting circuits 1436 may convert the count code CODE<0> input from the masking circuit 1435 into a binary code Code_B<0> and may output the binary code Code_B<0>. According to some embodiments, the count code generator 1431 may output a gray code as the count code CODE<0>. The one of the plurality of code converting circuits 1436 may convert the count code CODE<0> into the binary code Code_B<0>. Further, the binary code Code_B<0> may be calculated in the operating circuit 1439 and output the calculated binary code Code_B<0>. The plurality of code converting circuits 1436 may be configured to receive the codes (CODE<0> to CODE<4>), respectively. For example, when the count codes (CODE<0> to CODE<4>) from the count code generator 1431 are 5-bit, the number of the code converting circuits 1436 may be five as illustrated in FIG. 6 such that the five code converting circuits 1436 may receive the 5-bit count codes (CODE<0> to CODE<4>), respectively. Further, the five code converting circuits 1436 may output 5-bit binary codes (CODE_B<0> to CODE_B<4>).

For example, the plurality of code selecting circuits 1437 may be configured to receive the binary codes (CODE_B<0> to CODE_B<4>), respectively. For example, when the binary codes (CODE_B<0> to CODE_B<4>) from the plurality of code converting circuits 1436 are 5-bit, the number of the code selecting circuits 1437 are five such that the five code selecting circuits 1437 may receive the 5-bit binary codes (CODE_B<0> to CODE_B<4>), respectively.

The code selecting circuits 1437 may select the binary codes (CODE_B<0> to CODE_B<4>) and may transfer the selected binary codes to the operating circuit 1439. For example, the transferred binary codes may be added in the operating circuit 1439. For example, the first binary code CODE_B<0>, the second binary code CODE_B<1>, the third binary code CODE_B<2>, the fourth binary code CODE_B<3>, and the fifth binary code CODE_B<4> may be sequentially selected to be transferred to the operating circuit 1439 in this order. The operating circuit 1439 may add the transferred binary codes and may output the result.

Figure 7:
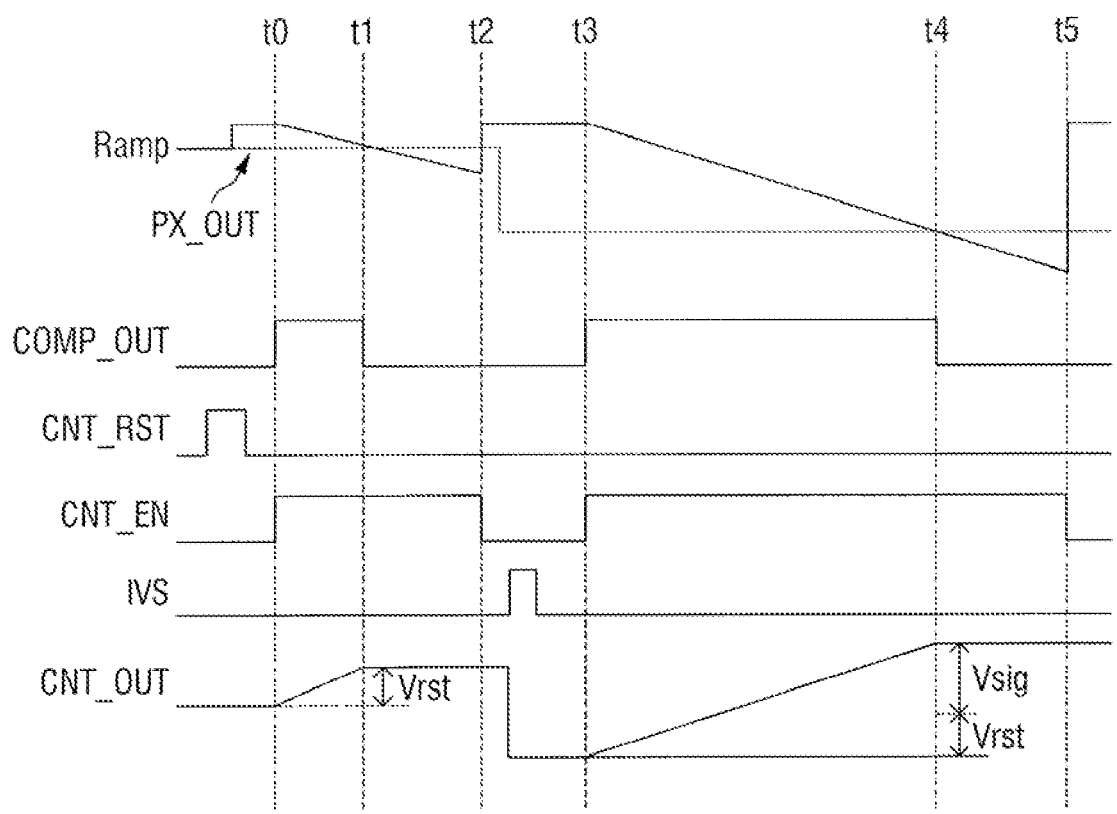
FIG. 7 illustrates a waveform of main signals for explaining the analog-digital converter according to some embodiments.

FIG. 7 illustrates a waveform of main signals for explaining an operation of the analog-digital converter (ADC) according to some embodiments. The operation of the analog-digital converter (ADC) according to the embodiment will be described below with reference to FIGS. 2 through 7.

A method of converting analog pixel signals PX_OUT generated by the plurality of pixels 1110 of the pixel array 1100 into digital signals may be performed by comparing the analog pixel signals PX_OUT and the reference signal RAMP that may fall at a predetermined constant slope. For example, the method of converting the analog pixel signals PX_OUT may be performed based on a time period for when the reference signal RAMP coincides with the values of the pixel signals PX_OUT from the plurality of pixels 1110. Referring to FIG. 7, the method may be performed by a method of obtaining a count result value corresponding to each magnitude of the pixel signal PX_OUT, by counting from a first time point t0, at which the value starts to fall, to a second time point t1, at which the reference signal RAMP and the pixel signal PX_OUT coincide with each other. For example, the first time point t0 may be a generation time point of the reference signal RAMP, and the second time point t1 may correspond to a crossing point between the reference signal RAMP and the pixel signal PX_OUT. For example, the pixel signal PX_OUT may include a video signal component Vsig and a reset component Vrst. For example, the video signal component Vsig may be generated after the reset component Vrst as illustrated in FIG. 7. The count value may be the number of counts when counting of the pixel signal PX_OUT is completed, or the count value may be the number of counts before counting of the pixel signal PX_OUT is completed.

A counter reset signal CNT_RST may be activated (e.g., logic high) by the counter controller 1620 for a predetermined period. The count value of the counter 1430A may be reset as an initial value by the activated counter reset signal. The reference signal RAMP may be input to the comparator 1410 from the reference signal generator 1610. The comparator 1410 may compare the voltage of the reference signal RAMP with the voltage of the pixel signal PX_OUT input from the column line as an output signal of the analog circuit 1300. For example, the output signal PX_OUT of the analog circuit 1300 may be referred to as a pixel signal PX_OUT.

According to some embodiments, referring to FIG. 7, the image sensor 1000 may perform a first reading operation and a second reading operation. For example, the first reading operation may be performed to obtain the reset component Vrst of the pixel signal PX_OUT, and the second reading operation may be performed to obtain the video signal component Vsig of the pixel signal PX_OUT. For example, the first reading operation may be performed from the first time point t0 to a third time point t2. For example, the reference signal RAMP may start to fall at the first time point t0 and may continually fall at a constant slop by the third time point t2. At the second time point t1, the reference signal RAM may be equal to the pixel signal PX_OUT. Thus, the comparator 1410 may invert the comparison result signal COMP_OUT from a logic high level to a logic low level. For example, the counter 1430A may stop the counting operation at the second time point t1, at which the comparison result signal COMP_OUT of the comparator 1410 is changed to a logic low level, and may latch the counting result of the counting operation as digital data. According to some embodiments, the count codes (CODE<0> to CODE<4>) may correspond to the counting result and may be latched to the latches 1434.

For example, referring to FIGS. 5 and 7, the count enable clock signal CNT_EN may be input to the count code generator 1431. For example, the count enable clock signal CNT_EN may be changed to a logic high level at the first time point t0 and may maintain a logic high level to the third time point t2, i.e., while the reference signal RAMP continuously falls down at a constant slope. Further, at the third time point t2, the count enable clock signal CNT_EN may be changed to a logic low level, and the reference signal RAMP may become larger than the pixel signal PX_OUT. For example, after the third time point t2, the count enable clock signal CNT_EN with a logic high level may not be supplied to the count code generator 1431.

Thus, a counting operation for the count result value CNT_OUT of the counter 1430A may start at the first time point t0 as the generation time point of the reference signal RAMP. A count value corresponding to a voltage magnitude of the reset component Vrst may be obtained by counting a clock signal from the first time point t0 to the second time point t1 when the comparator 1410 outputs the inverted output signal by a comparison operation thereof. According to some embodiments, a first sensing cycle may be referred to as a period from the first time point t0 to the third time point t2, in which the first reading operation of the image sensor 1000 is performed.

For example, after the first reading operation of the image sensor 1000 is completed and before the second reading operation starts, the counter 1430A may set the count value as a negative number corresponding to the same absolute value of the count value according to the inverted signal IVS input from the counter controller 1620. The second reading operation of the image sensor 1000 may be for obtaining the video signal component Vsig. For example, the video signal component Vsig may be obtained by removing the reset component Vrst from a reading result of the second reading operation.

For example, in the second reading operation of the image sensor 1000, the reading result of the second reading operation may correspond to the incident light amount for each pixel 1110 and may include the voltage magnitude of the reset component Vrst and the voltage magnitude of the video signal component Vsig. For example, the second reading operation may be performed in a similar manner to the first reading operation.

For the second reading operation of the image sensor 1000, the comparator 1410 may invert the comparison result signal COMP_OUT from a logic low level to a logic high level. For example, the comparison result signal COMP_OUT of the comparator 1410 may be changed from a logic low level to a logic high level at a fourth time point t3 when the reference signal RAMP starts to fall and may maintain a logic high level to a fifth time point t4 when the reference signal RAMP becomes equal to the pixel signal PX_OUT. For example, the plurality of counters 1430A in the analog-digital converter (ADC) 1400 may stop the counting operation at the fifth time point t4 when the comparison result signal COMP_OUT of the comparator 1410 is inverted and may latch the counting result of the counting operation up to the fifth time point t4 as digital data. According to some embodiments, the latched counting result may be implemented as the count codes (CODE<0> to CODE<4>). Therefore, the counting operation of the second reading operation may be executed between the fourth time point t3 and the fifth time point t4 (e.g., in a second sensing cycle).

For example, the count enable clock signal CNT_EN may be input to the counter 1430A. The count enable clock signal CNT_EN may be toggled at the fourth time point t3 when the reference signal RAMP starts to fall. The reference signal RAMP may fall at a constant slope by the sixth time point t5. The count enable clock signal CNT_EN may maintain a logic high level by the sixth time point t5. For example, after the sixth time point t5, the count enable clock signal CNT_EN with a logic high level may not be supplied to the counter 1430A.

For example, in the second reading operation, a counting operation for the count result value CNT_OUT of the counter 1430A may start at the fourth time point t3 as the generation time point of the reference signal RAMP. For example, the count value in the counter 1430A may become the negative number corresponding to the absolute value of the reset component Vrst according to the inverted signal IVS after the first reading. In other words, the counting operation for the count result value CNT_OUT may start with an initial count value of the negative number corresponding to the absolute value of the reset component Vrst. Thus, the count result value CNT_OUT may correspond to the video signal component Vsig, because the reset component Vrst is removed due to the initial count value of the negative number corresponding to the absolute value of the reset component Vrst. As a result, as the counter 1430A starts to count at the negative number corresponding to the absolute value of the reset component Vrst during the second reading operation, an additional subtraction operation for removing the reset component Vrst from the count result value CNT_OUT may not be necessary. Thus, the count result value CNT_OUT corresponding to the video signal component Vsig may be maintained in the counter 1430A.

For example, the count result value CNT_OUT generated by the second reading operation may be a digital value corresponding to "(Vrst+Vsig)+(−Vrst)=Vsig". Further, although it is explained in FIG. 3 that the reset component Vrst is removed according to the inverted signal IVS, the same result may be obtained, by performing a down-count operation in the case of the reset signal, and by performing an up-count operation in the case of the video signal.

The masking circuit 1435 according to some embodiments may be controlled to consume power only in a period, in which the operating circuit 1439 is driven. For example, the operation of the operating circuit 1439 may not be required from the first time point t0 to the second time point t2, i.e., when the count enable clock signal CNT_EN is at a logic high level and when the count code CODE<0> which is a count value of the comparison result signal COMP_OUT of the comparator 1410 is stored in the latch 1434. For example, as the switch of the masking circuit 1435 may be opened to block transmission of the count code CODE<0> to the operating circuit 1439 from the first time point t0 to the second time point t2, the operation of the operating circuit 1439 may not be necessary. For example, the operation of the operating circuit 1439 may be executed from the third time point t2 to the fourth time point t3, i.e., when the count code CODE<0> is stored in the latch 1434, when the count enable clock signal CNT_EN is at a logic low level, and when the switch of the masking circuit 1435 is shorted to allow transmission of the count code CODE<0> to the operating circuit 1439.

As a result, it is possible to reduce a power consumption of the counter 1430A by stopping the operating circuit 1439 when the operation of the operating circuit 1439 may not be required. In contrast, if an additional subtraction operation for removing the reset component Vrst from the count result value CNT_OUT is required, the operating circuit 1439 may perform the additional subtraction from the third time point t2 to the fourth time point t3 so that the power consumption of the counter 1430A may not be reduced. Further, the comparison result signal COMP_OUT of the comparator 1410 may not be converted into a short pulse using a delay circuit, but a long pulse of the comparison result signal COMP_OUT may be used, and any massaging method is not applied to the comparison result signal COMP_OUT. Thus, it is possible to prevent loss of information due to delay, coupling of external nodes, or the like in the signal conversion process. Thus, it is possible to minimize deterioration of information due to external factors, e.g., coupling and power fluctuation that may occur when using a delay circuit or the like.

Figure 8:
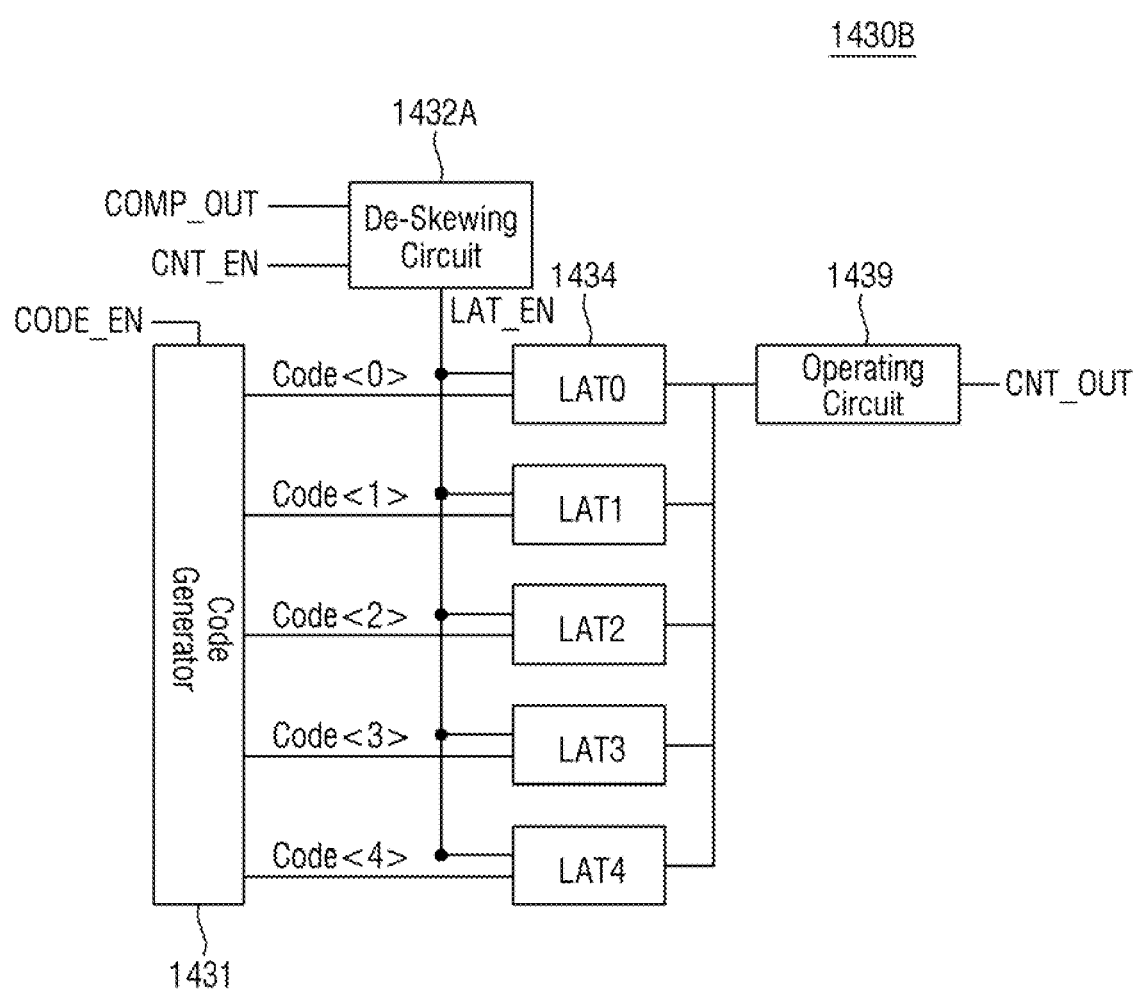
FIG. 8 illustrates a counter according to some embodiments.
Figure 9A:
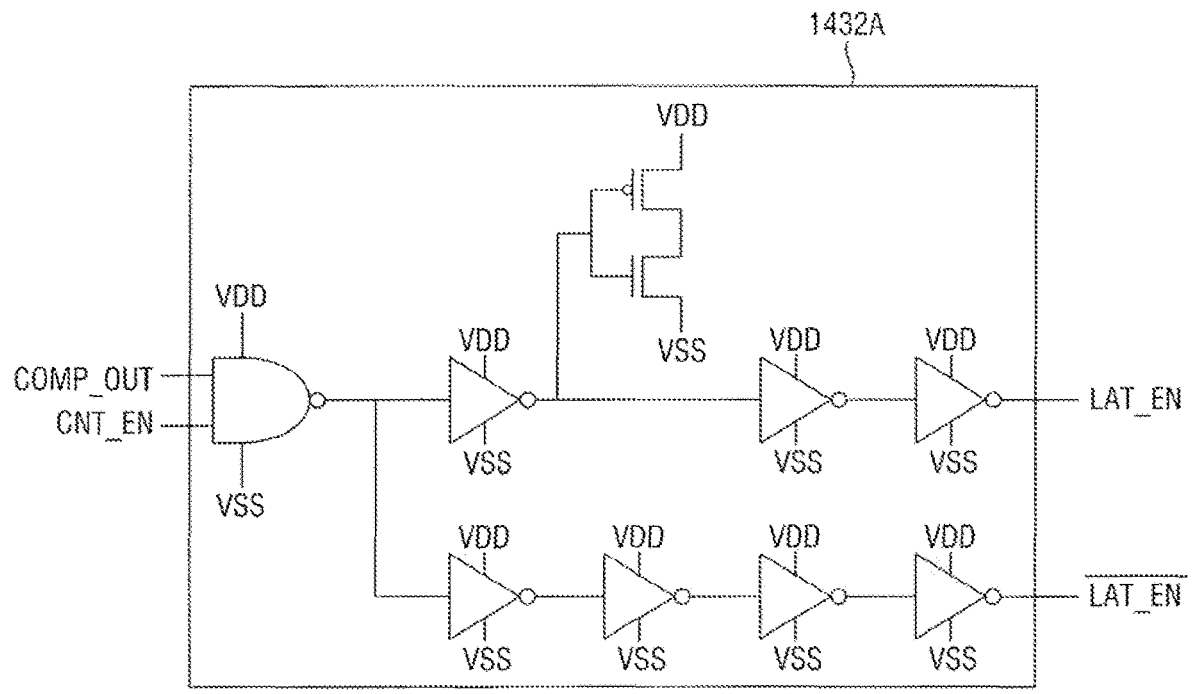
FIG. 9a illustrates a de-skewing circuit according to some embodiments.
Figure 9B:
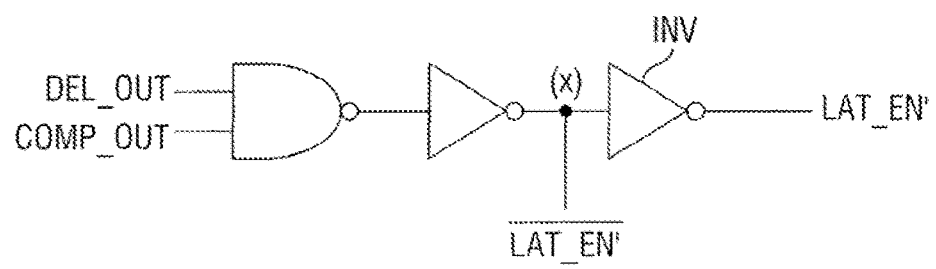
FIG. 9b illustrates an example for explaining a catching operation of a latch enable clock signal in a conventional delay circuit.

FIG. 8 illustrates an example for explaining a counter according to some embodiments. FIG. 9a illustrates an example for explaining a de-skewing circuit according to some embodiments, and FIG. 9b illustrates an example for explaining a catching operation of a latch enable clock signal in a conventional delay circuit. Referring to FIGS. 8 and 9a, a counter 1430B according to some embodiments may include a de-skewing circuit 1432A that is connected to an input terminal of the latch 1434 and outputs a latch enable clock signal LAT_EN for controlling a timing at which the count code CODE<0> is stored in the latch 1434.

The de-skewing circuit 1432A may receive the comparison result signal COMP_OUT as an output of the comparator 1410 and the count enable clock signal CNT_EN output from the counter controller 1620 and may output a latch enable clock signal LAT_EN for controlling the timing at which the count code CODE<0> is stored in the latch 1434 and the latch enable clock bar signal $\overline{\text{LAT\_EN}}$ having the logic level complementary to the latch enable clock signal LAT_EN. For example, the latch enable clock signal LAT_EN and the latch enable clock bar signal $\overline{\text{LAT\_EN}}$ may be caught and output at the same time point. According to some embodiments, the logic level of the latch enable clock signal LAT_EN may be the same as the logic level of the comparison result signal COMP_OUT.

The latch enable clock signal LAT_EN and the latch enable clock bar signal $\overline{\text{LAT\_EN}}$ output from the de-skewing circuit 1432A may control latch timings of the plurality of latches LAT0 to LAT4 for latching the codes (CODE<0> to CODE<4>) output by the count code generator 1431. In other words, the operations of the plurality of latches may be controlled by a differential signal or a differential pair (e.g., the latch enable clock signal LAT_EN and the latch enable clock bar signal $\overline{\text{LAT\_EN}}$).

Referring to FIG. 9b, in a conventional delay circuit, there is a delay in a catching timing of a latch enable clock signal LAT_EN' and a latch enable clock bar signal $\overline{\text{LAT\_EN}}$' for controlling the latch timing for the plurality of latches. For example, the latch enable clock signal LAT_EN' and the latch enable clock bar signal $\overline{\text{LAT\_EN}}$' may be output based on an output signal DEL_OUT of the delay circuit and the output signal COMP_OUT of the comparator 1410. Thus, there is a difference in catching timing corresponding to the gate delay of the inverter INV between the latch enable clock bar signal $\overline{\text{LAT\_EN}}$' as an output at a node (x) and the latch enable clock signal LAT_EN', and there is a possibility of information loss in latched data (e.g., count code).

In contrast, the counter 1430B according to the embodiment may control a storage timing of the latch 1434, using a differential signal (e.g., the latch enable clock signal LAT_EN and the latch enable clock bar signal $\overline{\text{LAT\_EN}}$) latched at the same timing using the de-skewing circuit 1432A. Thus, deterioration of information may be prevented. Further, by controlling the driving of all latches LAT0 to LAT4 using one differential signal (e.g., the latch enable clock signal LAT_EN and the latch enable clock bar signal $\overline{\text{LAT\_EN}}$), it is possible to improve a voltage drop IR-drop generated by toggling of the plurality of bits.

Figure 10:
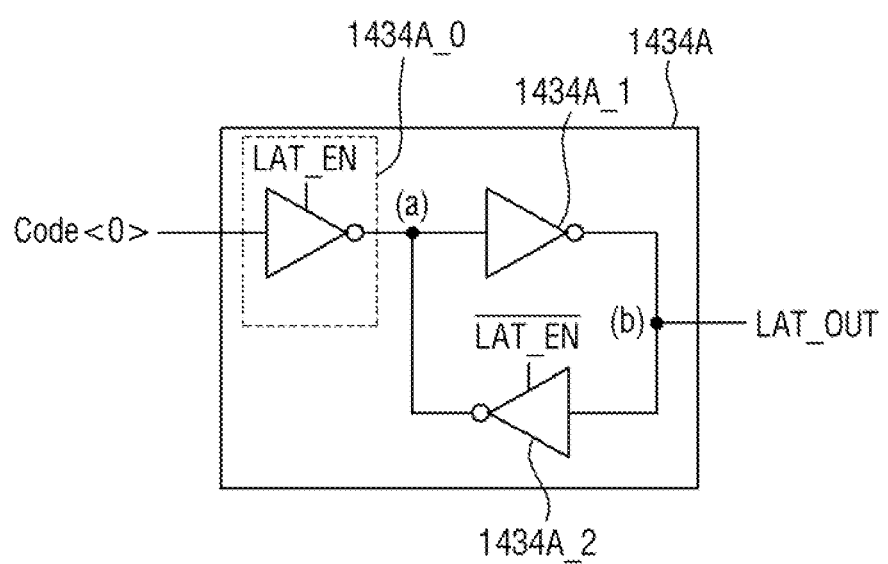
FIG. 10 illustrates a latch according to some embodiments.
Figure 11:
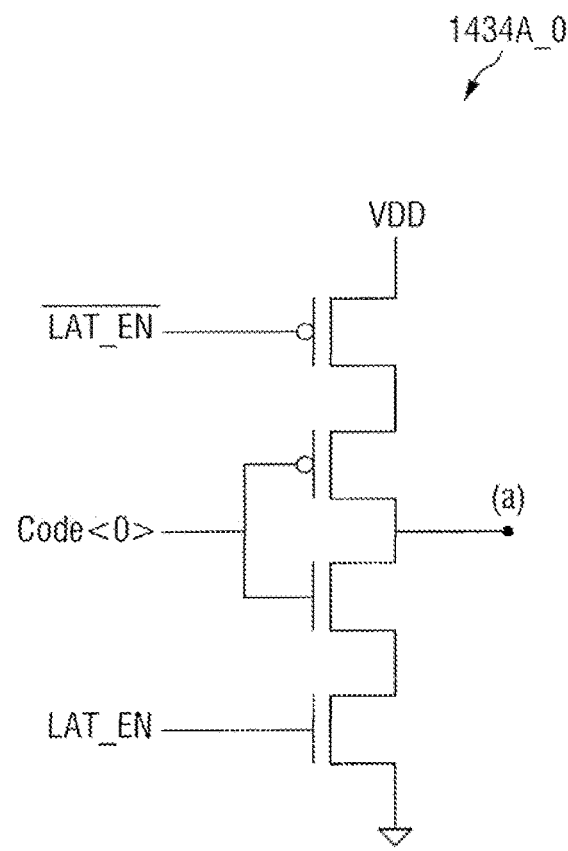
FIG. 11 illustrates an example of the latch in FIG. 10.
Figure 12:
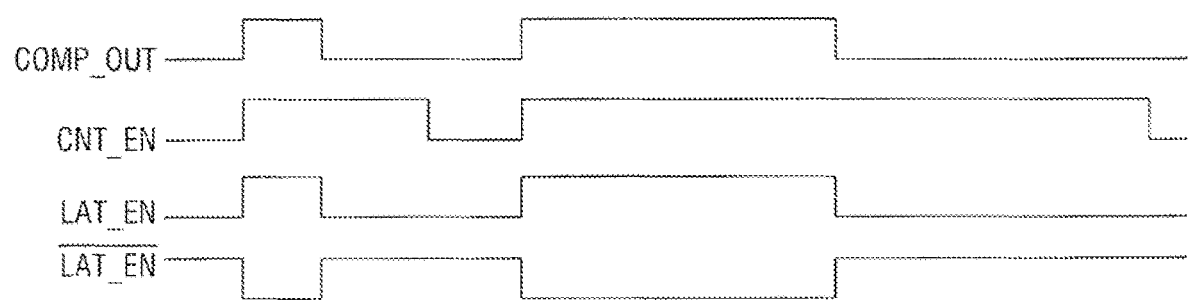
FIG. 12 illustrates a waveform for explaining an input/output operation of the de-skewing circuit according to some embodiments.

FIG. 10 illustrates an example for explaining the latch according to some embodiments, and FIG. 11 illustrates an example for explaining the configuration of the latch in FIG. 10 in more detail. FIG. 12 illustrates a waveform for explaining an input/output operation of the de-skewing circuit according to some embodiments.

Referring to FIGS. 10 and 11, a latch 1434A according to some embodiments may include a first tri-state inverter 1434A_0, a second tri-state inverter 1434A_1, and a third tri-state inverter 1434A_2. The first, second, and third tri-state inverters 1434A_0, 1434A_1, and 1434A_2 may receive the latch enable clock signal LAT_EN input to enable terminals thereof and the latch enable clock bar signal $\overline{\text{LAT\_EN}}$ input to inverse enable terminals thereof.

The first tri-state inverter 1434A_0 may receive the count code CODE<0> through an input terminal thereof. An output terminal of the first tri-state inverter 1434A_0 may be connected to a node (a). The second tri-state inverter 1434A_1 may have an input terminal connected to the node (a) and an output terminal connected to a node (b). The third tri-state inverter 1434A_2 may have an input terminal connected to the node (b) and an output terminal connected to the node (a).

Referring to FIG. 12, the latch enable clock signal LAT_EN may have the same logic level as that of the comparison result signal COMP_OUT. According to some embodiments, when the logic level of the comparison result signal COMP_OUT is logic high, the count code CODE<0> may be stored in the latch 1434A. When the logic level of the comparison result signal COMP_OUT is logic low, the count code CODE<0> may not be stored in the latch 1434A. In other words, when the logic level of the latch enable clock signal LAT_EN is logic high, the count code CODE<0> may be stored in the latch 1434A. When the logic level of the latch enable clock signal LAT_EN is logic low, the count code CODE<0> may not be stored in the latch 1434.

Figure 13:
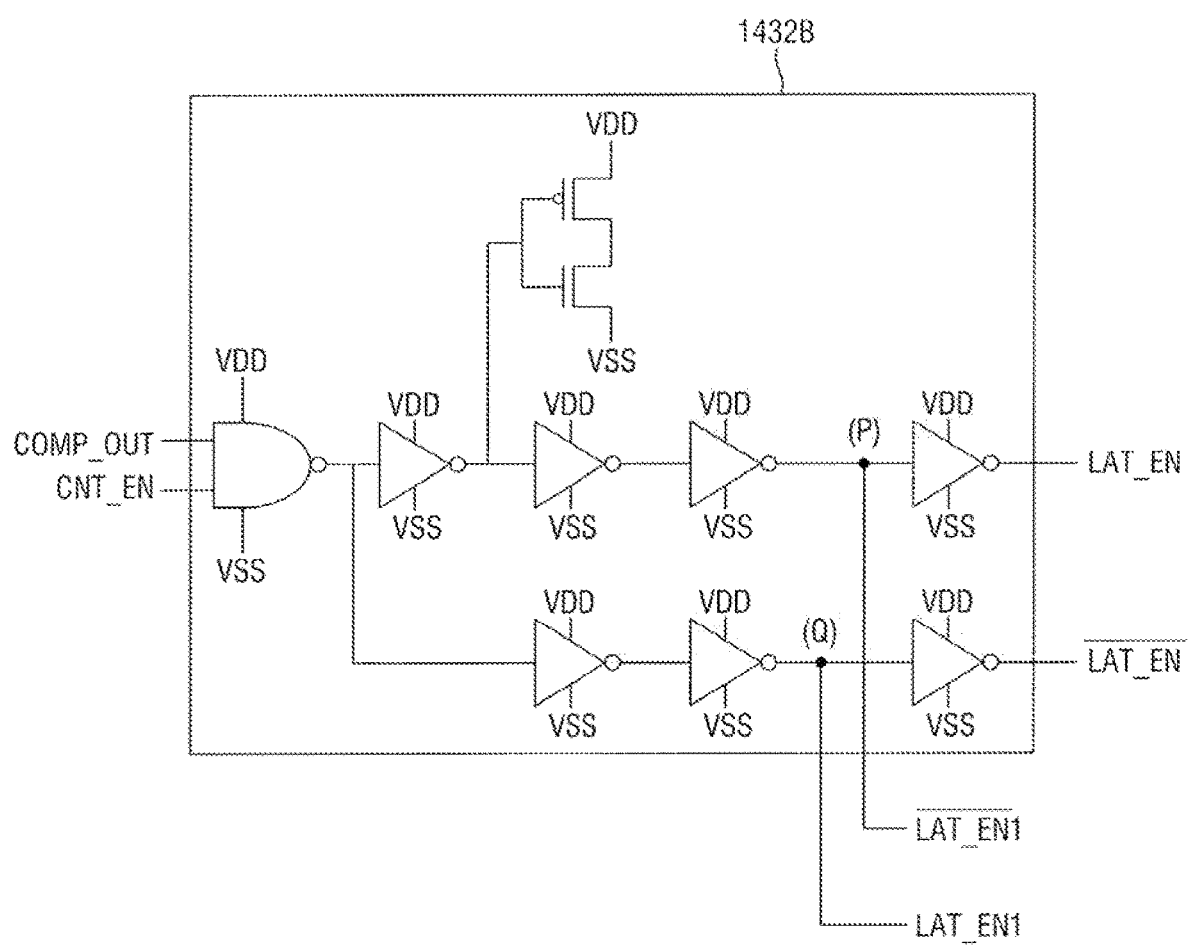
FIG. 13 illustrates an example for explaining a catching operation of a latch enable clock signal in the de-skewing circuit according to some embodiments.
Figure 14:
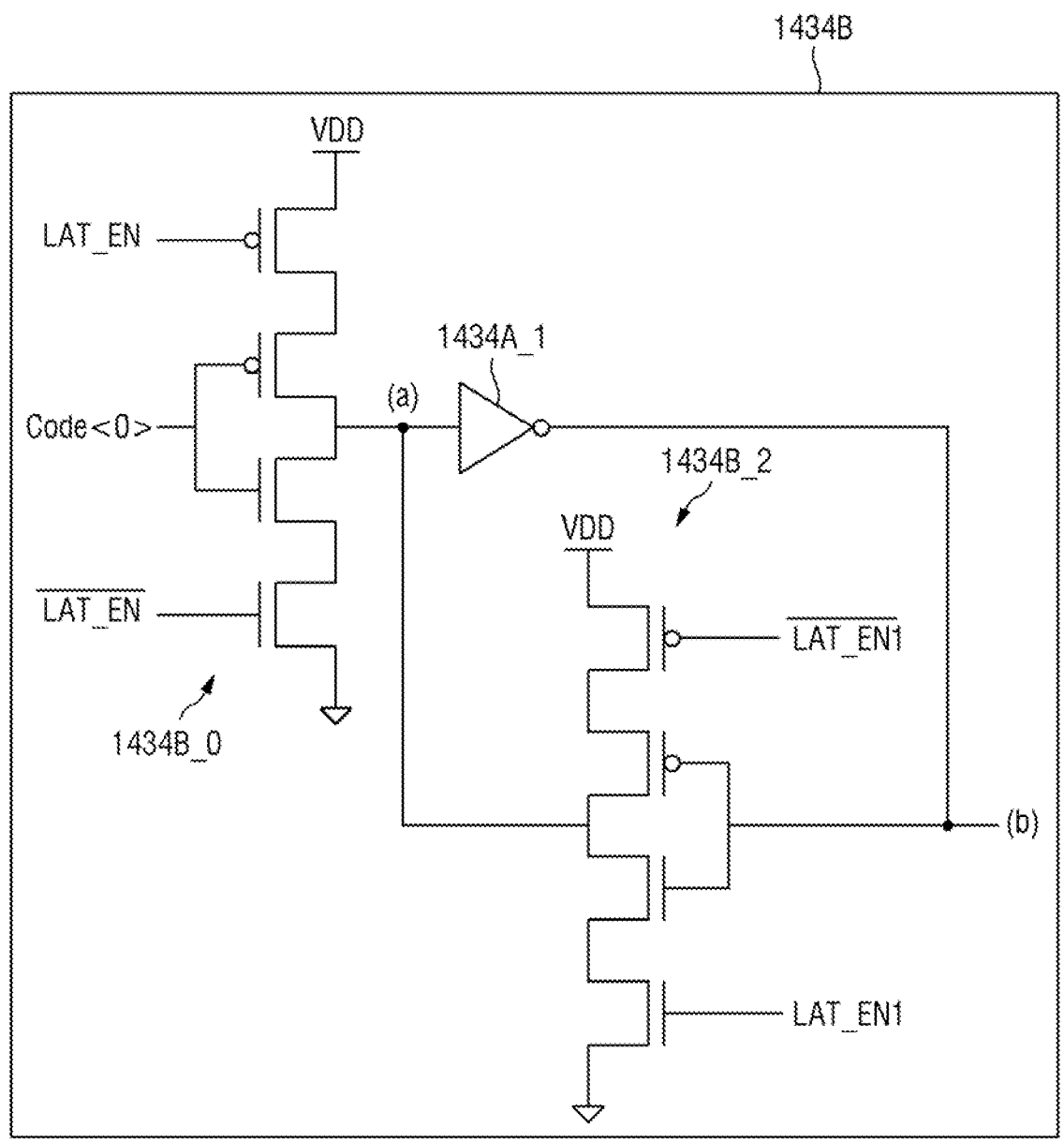
FIG. 14 illustrates an example for explaining an exemplary operation for outputting the latch enable clock signal from the de-skewing circuit in FIG. 13 to the latch.
Figure 15:
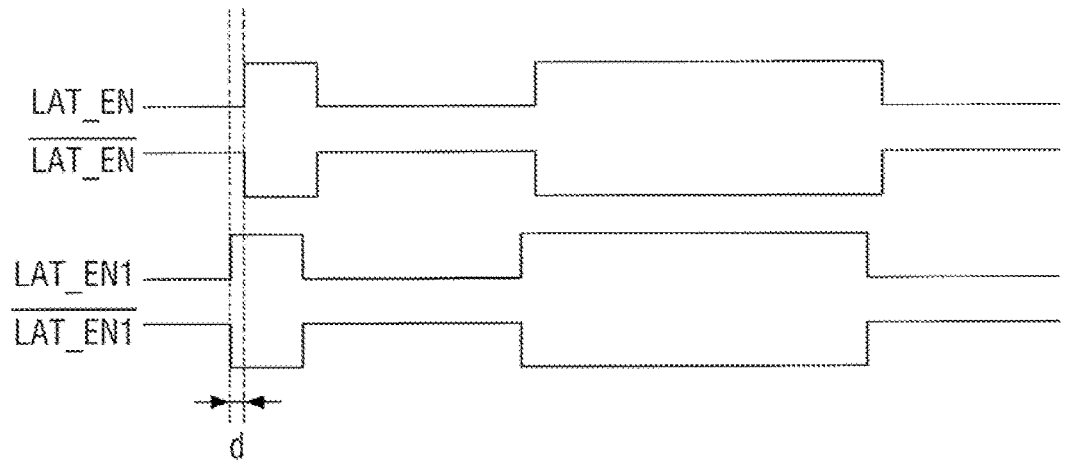
FIG. 15 illustrates a waveform for explaining an operation of the latch according to the latch enable clock signal input to the latch in FIG. 14.

FIG. 13 illustrates an example for explaining a catching operation of a latch enable clock signal in a de-skewing circuit according to some embodiments. FIG. 14 illustrates an example for explaining an exemplary operation in which the latch enable clock signal output from the de-skewing circuit in FIG. 13 is input to the latch. FIG. 15 illustrates a waveform for explaining an operation of a latch according to the latch enable clock signal input to the latch in FIG. 14.

Referring to FIGS. 13 to 15, a de-skewing circuit 1432B according to some embodiments may differently apply a catching timing of the latch enable clock signal input to the plurality of inverters included in a latch 1434B. In the latch 1434A shown in FIG. 10 described above, when "0" is input to the count code CODE<0>, the bit value at the node (a) becomes "1", and the bit value at the node (b) becomes "0". After that, when the count code CODE<0> transitions to "1", even though the bit value at the node (a) may need to transition to "0", a hysteresis phenomenon, in which the output terminal of third tri-state inverter 1434A_2 is also connected to the node (a) and tries to maintain a value of "1", may occur.

The de-skewing circuit 1432B according to some embodiments may differently apply the catching timing of the latch enable clock signal input to inverters 1434B_0 and 1434B_2 in the latch 1434B. For example, a first latch enable clock signal LAT_EN and a first latch enable clock bar signal $\overline{\text{LAT\_EN}}$ may be input to each of the enable terminal and the inverse enable terminal of the first tri-state inverter 1434B_0. A second latch enable clock bar signal $\overline{\text{LAT\_EN1}}$ and a second latch enable clock signal LAT_EN1 may be input to each of the enable terminal and the inverse enable terminal of the third tri-state inverter 1434B_2. For example, referring to FIG. 13, the first latch enable clock signal LAT_EN and the first latch enable clock bar signal $\overline{\text{LAT\_EN}}$ may be signals at outputs of the de-skewing circuit 1432B. The second latch enable clock bar signal $\overline{\text{LAT\_EN1}}$ and the second latch enable clock signal LAT_EN1 may be signals at a node (P) and a node (Q), respectively. For example, the first latch enable clock signal LAT_EN and the first latch enable clock bar $\overline{\text{LAT\_EN}}$ may be delayed from the second latch enable clock bar signal $\overline{\text{LAT\_EN1}}$ and the second latch enable clock signal LAT_EN1 by a gate delay (d). Thus, phases of the second latch enable clock bar signal $\overline{\text{LAT\_EN1}}$ and the second latch enable clock signal LAT_EN1 may be more advanced than phases of the first latch enable clock signal LAT_EN and the first latch enable clock bar signal $\overline{\text{LAT\_EN}}$ by the gate delay (d). Thus, the third tri-state inverter 1434B_2 may receive the second latch enable clock bar signal $\overline{\text{LAT\_EN1}}$ and the second latch enable clock signal LAT_EN1 in advance when the first tri-state inverter 1434B_0 receives the first latch enable clock signal LAT_EN and the first latch enable clock bar signal $\overline{\text{LAT\_EN}}$. As a result, an output value of the third tri-state inverter 1434B_2 may be changed in advance to eliminate the hysteresis phenomenon.

Figure 16:
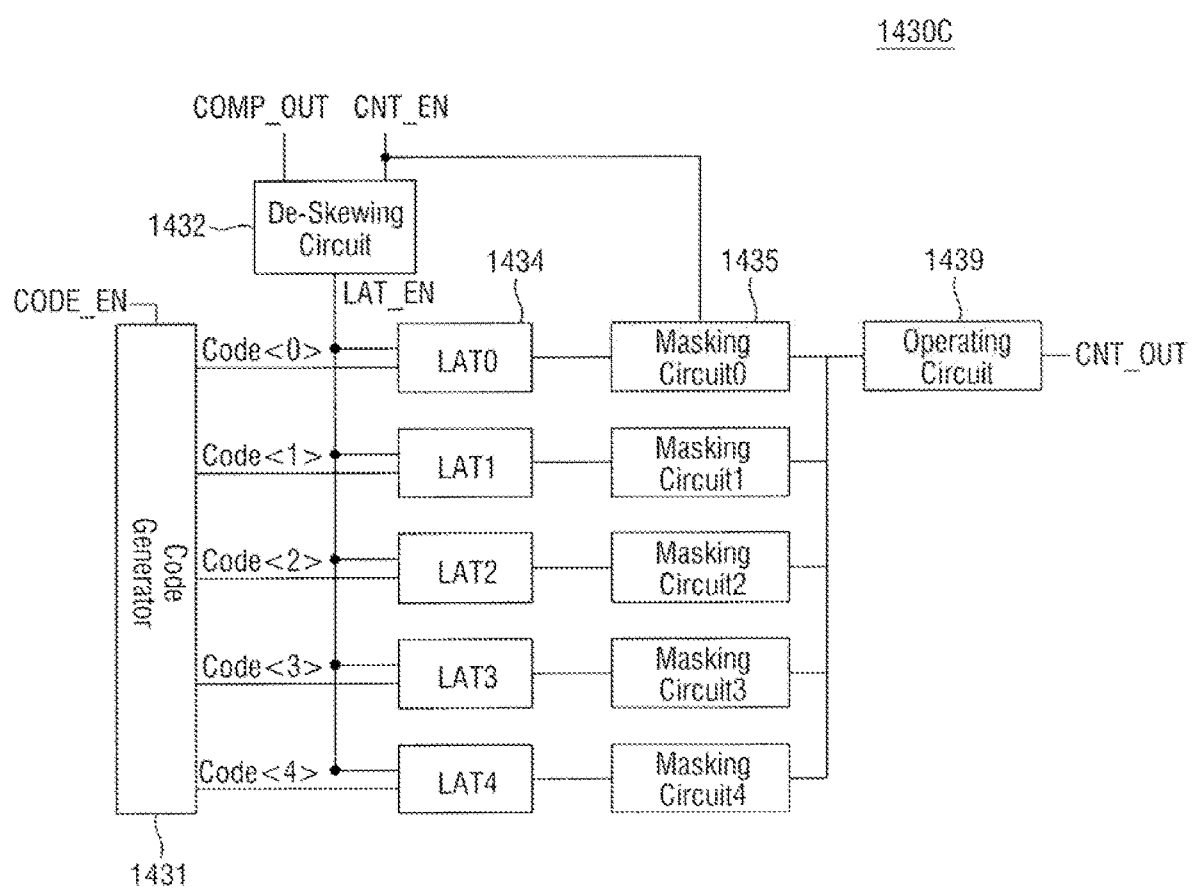
FIG. 16 illustrates an example for explaining the counter according to some embodiments.

FIG. 16 illustrates an example for explaining the counter according to some embodiments. Referring to FIG. 16, a counter 1430C according to some embodiments may include both a de-skewing circuit 1432 and a masking circuit 1435. The de-skewing circuit 1432 and the masking circuit 1435 may operate in the same manner as described above.

The counter 1430C may generate and output a latch enable clock signal LAT_EN to input terminals of the latches 1434, may receive the comparison result signal COMP_OUT and the count enable clock signal CNT_EN, and may control a catch timing of the count code CODE<0> based on the comparison result signal COMP_OUT and the count enable clock signal CNT_EN.

For example, the de-skewing circuit 1432 may receive the comparison result signal COMP_OUT as the output of the comparator 1410 and the count enable clock signal CNT_EN output from the counter controller 1620 and may output the latch enable clock signal LAT_EN for controlling a timing at which the count code CODE<0> is stored in the latch 1434 and a latch enable clock bar signal $\overline{\text{LAT\_EN}}$ having a logic level complementary to the latch enable clock signal LAT_EN. For example, the latch enable clock signal LAT_EN and the latch enable clock bar signal $\overline{\text{LAT\_EN}}$ may be caught and output at the same time point. According to some embodiments, the logic level of the latch enable clock signal LAT_EN may be the same as the logic level of the comparison result signal COMP_OUT.

The latch enable clock signal LAT_EN and the latch enable clock bar signal $\overline{\text{LAT\_EN}}$ output by the de-skewing circuit 1432 may control the latch timings of the plurality of latches LAT0 to LAT4 of the codes (CODE<0> to CODE<4>) output by the count code generator 1431. For example, the entire driving of the plurality of latches may be controlled by a differential signal or a differential pair (e.g., the latch enable clock signal LAT_EN and the latch enable clock bar signal $\overline{\text{LAT\_EN}}$).

The masking circuit 1435 may include a pass transistor. According to some embodiments, the masking circuit 1435 may include a pass transistor that determines whether to open or short a switch according to a logic level of the count enable clock signal CNT_EN.

In the pass transistor in the masking circuit 1435, a count enable clock signal CNT_EN may be input to a gate electrode of a PMOS transistor, and a count enable clock bar signal $\overline{\text{CNT\_EN}}$ may be input to a gate electrode of an NMOS transistor. Accordingly, the masking circuit 1435 may operate so that when the logic level of the count enable clock signal CNT_EN is logic high, the switch may open and the count code CODE<0> may not be transferred to the operating circuit 1439. Further, the masking circuit 1435 may operate so that when the logic level of the count enable clock signal CNT_EN is logic low, the switch may be shorted and the count code CODE<0> may be transferred to the operating circuit 1439.

Accordingly, as the counter 1430C according to the embodiment does not change a pulse of the comparison result signal COMP_OUT by an additional circuit, e.g., a delay circuit, it is possible to prevent loss of information due to coupling or the like of the external node, and it is possible to reduce the power consumption of the counter 1430 through the masking circuit 1435 that activates the operating circuit 1439 only at the period in which the operation of the operating circuit 1439 is required. In addition, by similarly controlling the latch timing of the count codes (CODE<0> to CODE<4>) stored in the plurality of latches LAT0 to LAT4 through the de-skewing circuit 1432, deterioration of information may be minimized, and by driving the entire latches LAT0 to LAT4 through a differential signal (the latch enable clock signal LAT_EN and the latch enable clock bar signal $\overline{\text{LAT\_EN}}$) the outputs of the de-skewing circuit 1432, IR-drop may be improved.

By way of summation and review, an analog-digital converter and an image sensor according to implementations may reduce power consumed by a counter by selectively activating the operation of the counter through a masking circuit. An analog-digital converter and an image sensor according to implementations may prevent the deterioration of information by controlling the timing at which codes are stored in a plurality of latches through a de-skewing circuit. An analog-digital converter and an image sensor according to implementations may minimize a voltage drop by controlling a timing at which codes are stored in a plurality of latches with one signal. An analog-digital converter and an image sensor according to implementations may prevent information deterioration due to external factors by not changing a pulse width of a signal.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An image sensor, comprising:
a comparator configured to generate a comparison signal by comparing a pixel signal and a reference signal;
a count code generator configured to generate a count code;
a latch configured to latch the generated count code; and
a masking circuit configured to transfer or not to transfer the latched count code to an operating circuit in response to a count enable clock signal, wherein:
the operating circuit includes an adder configured to generate a digital signal corresponding to the pixel signal, and
the latched count code is transferred to the operating circuit when the count enable clock signal has a first logic level.

2. The image sensor as claimed in claim 1, wherein the latched count code is not transferred to the operating circuit when the count enable clock signal has a second logic level complementary to the first logic level.

3. The image sensor as claimed in claim 1, wherein the generated count code and the latched count code are each a gray code.

4. The image sensor as claimed in claim 3, wherein:
the pixel signal includes a reset component and an image component,
the comparator is configured to compare the reset component and the reference signal and generate a first comparison signal, and compare the image component and the reference signal and generate a second comparison signal, successively, the comparison signal generated by the comparator including the first and the second comparison signals,
the generated count code is latched when each of the first comparison signal and the second comparison signal is changed, and
the latched count code includes a first latched gray code and a second latched gray code.

5. The image sensor as claimed in claim 4, further comprising a code converting circuit configured to:
receive the first latched gray code and the second latched gray code through the masking circuit according to the count enable clock signal; and
convert the first latched gray code and the second latched gray code to a first binary code and a second binary code, respectively.

6. The image sensor as claimed in claim 5, wherein the adder is configured to add the first binary code and the second binary code to generate the digital signal.

7. The image sensor as claimed in claim 1, wherein the count code generator is configured to:
generate the count code when the count enable clock signal has a second logic level complementary to the first logic level; and
not generate the count code when the count enable clock signal has the first logic level.

8. The image sensor as claimed in claim 1, wherein the masking circuit includes a pass transistor including an NMOS transistor and a PMOS transistor.

9. The image sensor as claimed in claim 1, further comprising a de-skewing circuit configured to generate a first latch enable signal and a second latch enable signal in response to the comparison signal, wherein:

the first latch enable signal and the second latch enable signal are a differential pair, and
the latch is configured to store and maintain the count code in response to the first and the second latch enable signals.

10. The image sensor as claimed in claim 9, wherein:
the de-skewing circuit is further configured to generate a third latch enable signal and a fourth latch enable signal in response to the comparison signal,
the third latch enable signal and the fourth latch enable signal are a differential pair, and
phases of the third latch enable signal and the fourth latch enable signal are advanced relative to phases of the first latch enable signal and the second latch enable signal, respectively.

11. An image sensor, comprising:
a comparator configured to generate a comparison signal by comparing a pixel signal and a reference signal;
a count code generator configured to generate a count code;
a latch configured to latch the generated count code in response to a latch enable signal; and
a de-skewing circuit configured to generate the latch enable signal in response to the comparison signal, the latch enable signal including a first latch enable signal and a second latch enable signal that are a differential pair,
wherein the de-skewing circuit is configured to catch and output the first latch enable signal and the second latch enable signal at a same first time point.

12. The image sensor as claimed in claim 11, wherein the de-skewing circuit includes:
a gate receiving the comparison signal and a count enable clock signal;
a first inverter connected to an output terminal of the gate;
a PMOS transistor and an NMOS transistor gated to an output terminal of the first inverter, a first terminal of the PMOS transistor being connected to a second terminal of the NMOS transistor;
a second inverter connected to the output terminal of the first inverter;
a third inverter connected to an output terminal of the second inverter, and outputting the first latch enable signal;
a fourth inverter connected to the output terminal of the gate;
a fifth inverter connected to an output terminal of the fourth inverter;
a sixth inverter connected to an output terminal of the fifth inverter; and
a seventh inverter connected to an output terminal of the sixth inverter, and outputting the second latch enable signal.

13. The image sensor as claimed in claim 11, wherein the de-skewing circuit is further configured to catch and output a third latch enable signal and a fourth latch enable signal, which are differential pair, at a same second time point that is before the first time point.

14. The image sensor as claimed in claim 13, wherein the de-skewing circuit further includes:
a gate receiving the comparison signal and a count enable clock signal;
a first inverter connected to an output terminal of the gate;
a PMOS transistor and an NMOS transistor gated to an output terminal of the first inverter, a first terminal of the PMOS transistor being connected to a second terminal of the NMOS transistor;

a second inverter connected to the output terminal of the first inverter;

a third inverter connected to an output terminal of the second inverter, and outputting the third latch enable signal;

a fourth inverter connected to an output terminal of the third inverter, and outputting the first latch enable signal;

a fifth inverter connected to the output terminal of the gate;

a sixth inverter connected to an output terminal of the fourth inverter, and outputting the fourth latch enable signal; and a seventh inverter connected to an output terminal of the sixth inverter, and outputting the second latch enable signal.

15. A method of operating an image sensor, the method comprising:

generating a comparison signal by comparing a pixel signal and a reference signal;

generating a count code;

latching the generated count code when the comparison signal is changed;

transferring the latched count code to an operating circuit when a count enable clock signal is a first logic level; and not transferring the latched count code to the operating circuit when the count enable clock signal is a second logic level complementary to the first logic level.

16. The method as claimed in claim 15, wherein the generated count code and the latched count code are each a gray code.

17. The method as claimed in claim 16, wherein the comparison signal includes a first comparison signal and a second comparison signal, and the pixel signal includes a reset component and an image component, the method further comprising:

comparing the reset component and the reference signal, and generating the first comparison signal, comparing the image component and the reference signal, and generating the second comparison signal, successive to generating the first comparison signal, wherein latching the generated count code includes latching the generated count code when each of the first comparison signal and the second comparison signal is changed, and the latched count code includes a first latched gray code and a second latched gray code.

18. The method as claimed in claim 17, further comprising:

receiving the first latched gray code and the second latched gray code according to the count enable clock signal, and converting the first latched gray code and the second latched gray code to a first binary code and a second binary code, respectively.

19. The method as claimed in claim 18, further comprising adding the first binary code and the second binary code to generate a digital signal corresponding to the pixel signal.

20. The method as claimed in claim 16, further comprising generating a first latch enable signal and a second latch enable signal in response to the comparison signal, wherein the first and the second latch enable signals are a differential pair, wherein latching the generated count code includes storing and maintaining the count code in response to the first latch enable signal and the second latch enable signals instead of the comparison signal.

* * * * *